(12) United States Patent
Oldenkamp et al.

(10) Patent No.: US 8,933,324 B2
(45) Date of Patent: Jan. 13, 2015

(54) THERMALLY MOUNTING ELECTRONICS TO A PHOTOVOLTAIC PANEL

(75) Inventors: Hendrik Oldenkamp, The Hague (NL); Irene Johanna De Jong, The Hague (NL)

(73) Assignee: SMA Solar Technology AG, Neubiberg (DE)

( * ) Notice: Subject to any disclaimer, the term of this patent is extended or adjusted under 35 U.S.C. 154(b) by 160 days.

(21) Appl. No.: 13/343,872

(22) Filed: Jan. 5, 2012

(65) Prior Publication Data

US 2012/0167950 A1 Jul. 5, 2012

Related U.S. Application Data

(63) Continuation-in-part of application No. PCT/EP2010/059860, filed on Jul. 9, 2010.

(30) Foreign Application Priority Data

Jul. 9, 2009 (EP) ..................................... 09165077

(51) Int. Cl.
*H01L 31/052* (2014.01)
*H05K 7/20* (2006.01)
*H01L 31/048* (2014.01)

(52) U.S. Cl.
CPC ........ *H01L 31/0485* (2013.01); *H01L 31/0486* (2013.01); *Y02E 10/50* (2013.01)
USPC ............ 136/246; 136/244; 361/707; 361/709

(58) Field of Classification Search
CPC ..... H01L 31/048; H01L 31/042; H01L 31/05; H01L 31/0516; H01L 31/04862; H01L 31/052; H01L 31/0485; H01L 31/0486; H01L 21/4882; H05K 7/20; Y02E 10/50

USPC .................. 136/204, 244, 246; 361/707, 709
See application file for complete search history.

(56) References Cited

U.S. PATENT DOCUMENTS

| | | | | |
|---|---|---|---|---|
| 5,262,922 | A * | 11/1993 | Yamaji et al. | 361/720 |
| 6,565,549 | B1 * | 5/2003 | Allen et al. | 604/385.04 |
| 2005/0022859 | A1 * | 2/2005 | Nass et al. | 136/251 |
| 2005/0197001 | A1 | 9/2005 | Higashikozono et al. | |
| 2006/0233692 | A1 * | 10/2006 | Scaringe et al. | 423/335 |

(Continued)

FOREIGN PATENT DOCUMENTS

JP 2006147737 A 6/2006

OTHER PUBLICATIONS

International Search Report dated Dec. 16, 2011 for PCT Application No. PCT/EP2010/059860. 10 Pages.

*Primary Examiner* — Susan D Leong
(74) *Attorney, Agent, or Firm* — Eschweiler & Associates, LLC

(57) ABSTRACT

An electronics assembly for a photovoltaic panel includes a substrate of a thermally conductive material, wherein the substrate defines a thermal contact area for thermally contacting the electronics assembly to a photovoltaic panel; and at least one electronic component provided on the substrate and in thermal contact with the substrate, so that when the electronics assembly is in thermal contact with the photovoltaic panel. The thermal contact provides a heat conductive channel between the at least one electronic component and the photovoltaic panel, wherein the heat conductive channel enables the electronics assembly to use the photovoltaic panel as a heat sink for heat produced by the at least one electronic component.

14 Claims, 6 Drawing Sheets

(56) References Cited

U.S. PATENT DOCUMENTS

2007/0137689 A1* 6/2007 Feldmeier et al. ............ 136/244
2008/0000621 A1   1/2008 Hidaka et al.
2009/0032090 A1* 2/2009 Kats et al. ..................... 136/251

* cited by examiner

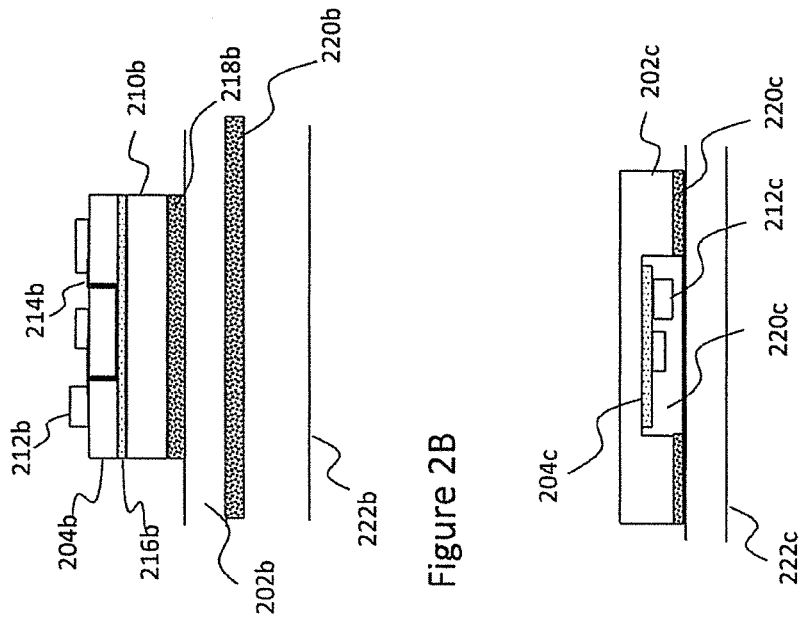
Figure 2B
Figure 2C
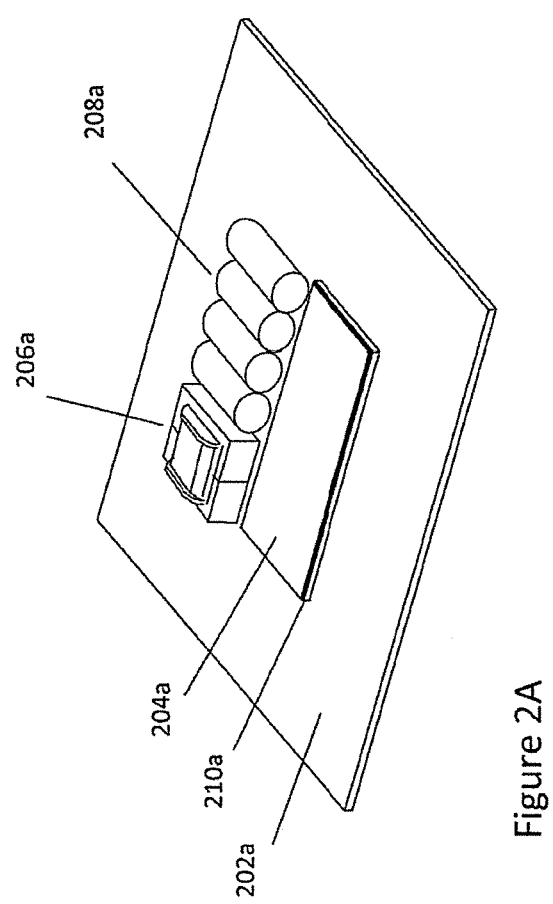
Figure 2A

THERMALLY MOUNTING ELECTRONICS TO A PHOTOVOLTAIC PANEL

CROSS REFERENCE TO RELATED APPLICATIONS

This application is a continuation-in-part (CIP) of International Application PCT/EP2010/059860, filed Jul. 9, 2010, which claims priority to European Patent Application No. 09 165 077.0, filed Jul. 9, 2009.

FIELD OF THE INVENTION

The invention relates to an electronics assembly for a photovoltaic panel and, in particular, though not exclusively, to an electronics assembly for use in thermal contact with a photovoltaic panel and a solar panel system comprising such electronics assembly.

BACKGROUND OF THE INVENTION

In order to reduce the amount of energy required from non-renewable energy sources, renewably energy sources, in particular solar energy, are the object of intense research. Currently a lot of effort is directed towards improving the overall conversion efficiency of a solar power system in order to make such systems ready for large-scale, commercial applications.

The basic building block of a solar power system is a so-called photovoltaic (PV) module or panel. Such PV panel may comprise many interconnected PV cells (e.g. Silicon or polymer-based PV cells connected in series and/or parallel) jointly generating about 50 W or more. The solar power system further comprises a power distribution system for effective coupling of the system to a power grid. For example, using a power distribution system, PV panels may be interconnected and arranged side-by-side, e.g. on a roof, to form a roof-integrated solar power system for domestic applications producing solar power on the order of kilowatts or more.

The power distribution system of the solar power system may comprise connection modules and cables for interconnecting the PV panels according to a predetermined electrical scheme. A connection module typically comprises one or more bypass diodes that are used to bypass a string of cells (typically in the range of 16 to 24 cells) inside a module in case one or more cells of the string are partially shaded. The power distribution system may further comprise one or more conversion modules, e.g. dc-ac converters (inverter) for conversion of the variable dc voltage output generated by one or more solar power panels into an ac current signal that is e.g. suitable for the power grid. Currently a trend is to provide each PV panel with its own electronics module comprising bypass diodes, an inverter, a dc-dc converter, a charge controller for a battery and further electronics, e.g. data exchange and monitoring electronics. Instead of a conventional bypass diode, active bypass diodes may be used. Such an active bypass diode comprises an electronic circuit providing the functionality of a diode with a very low forward voltage drop thereby providing a low power dissipation. Hence, the number of electronic components in state of the art solar power panels may increase steadily. Using such "smart" electronics modules, a power distribution system for a solar power system may be realized that allows individual control and monitoring of each PV panel in the system. Such electronics modules may comprise a protective housing and may be mounted at the back of each PV module.

As the electronics in these modules may produce heat, measures are required in order to keep the electronics below a certain temperature. These measures may include cooling structures, e.g. cooling fins, an air gap between the module and the back of the PV panel, and/or the use of thermally conductive materials such as an aluminum housing.

One example of such a module is described in US2008/0006321. The electronics module comprises an electronic switching and control unit that is in thermal contact with an cooling body comprising cooling fins in order to maintain a temperature upper limit. In more general, in conventional PV systems the heat dissipated by the electronics module mounted to the back of the PV panel is typically transported away from the PV panel towards the surrounding air using the mechanisms of convective and radiative heat transfer. At the same time, the heat transferred to the PV panel through the mechanism of heat conduction is minimized by thermally isolating the electronics from the PV module.

One problem of these known cooling schemes relates to the fact that—especially when mounted on a roof for an extended period of time—the space between the PV panel and the roof and the space between the cooling structures of the connection module may easily become clogged with dirt (e.g. twigs, leafs, etc.) thereby negatively affecting the convective and radiative transfer of heat generated by the electronic components to the surrounding air. As a consequence, the electronics in an electronics module may become too hot so that it may break down, may cause ageing effects and/or may cause drift in the electronics, thereby negatively affecting the overall conversion efficiency of the solar power system. A further problem relates to the fact that the cooling structures necessary for providing sufficient convective heat transfer are relatively complex structures, typically made out of aluminium or aluminium alloys and may thus be expensive to fabricate.

Hence there is a need in the prior art for an improved electronics assembly and/or module with an, under all circumstances, well defined thermal performance for a photovoltaic panel that is simple and low cost and provides improved operation of the electronics over an extended period of time.

SUMMARY

The present invention relates to an electronics assembly for a photovoltaic panel comprising a substrate of a thermally conductive material, wherein the substrate defines a thermal contact area for thermally contacting the electronics assembly to a photovoltaic panel. The assembly further comprises one or more electronic components provided on the substrate, and in thermal contact with the substrate; and a cover located over the electronic components and covering an area of the substrate. When the electronics assembly is in thermal contact with the photovoltaic panel, the thermal contact provides a heat conductive channel between the electronic components and the photovoltaic panel. Thus, the heat conductive channel enables the electronics assembly to use the photovoltaic panel as a heat sink for heat produced by the electronic components. To have a heat sink of an enlarged size, the area covered by the cover is substantially smaller than the contact area.

The present invention also relates to a solar panel system comprising at least one photovoltaic laminate comprising a plurality of photovoltaic cells generating an electrical signal from solar radiation, and an electronics assembly receiving the electrical signal from the photovoltaic cells in the laminate. The electronics assembly comprises a substrate of a thermally conductive material, the substrate defining a thermal contact area for thermally contacting the electronics assembly to a photovoltaic panel. The system comprises one or more electronic components provided on the substrate and in thermal contact with the substrate, so that when the electronics assembly is in thermal contact with the photovoltaic panel, the thermal contact providing a heat conductive channel between the electronic components and the photovoltaic panel, the heat conductive channel enables the electronics assembly to use the photovoltaic panel as a heat sink for heat produced by the electronic components. The size of the contact area is adapted to heat produced by the electronic components due to the electrical signal from the plurality of photovoltaic cells such that an energy of the heat produced by the electronic components is at maximum as high as an energy of that part of the solar radiation which is transformed into the electrical signal by that part of the plurality of photovoltaic cells in the contact area. Thus the photovoltaic panel will not get hotter in the contact area than without generation of the electrical signal, i.e. than with maximum transformation of solar irradiation into heat by the photovoltaic cells.

Further, the present invention relates to a solar panel system comprising at least one photovoltaic laminate comprising a plurality of photovoltaic cells arranged in rows and columns, and at least one electronics assembly for receiving an electrical signal from the plurality of photovoltaic cells in the laminate. The electronics assembly comprises a substrate of a thermally conductive material, wherein the substrate defines a thermal contact area for thermally contacting the electronics assembly to a photovoltaic panel; and one or more electronic components provided on the substrate and in thermal contact with the substrate, so that when the electronics assembly is in thermal contact with the photovoltaic panel, the thermal contact provides a heat conductive channel between the electronic components and the photovoltaic panel. The heat conductive channel enables the electronics assembly to use the photovoltaic panel as a heat sink for heat produced by the electronic components. The substrate is in thermal contact with at least two of the photovoltaic cells, and the substrate is partially overlapping with at least one of the photovoltaic cells with which it is in thermal contact. Due to the high thermal conductivity of the silicon PV cells, even the partial overlap allows for using nearly the entire surface area of the respective photovoltaic cells for heat dissipation.

In one embodiment the heat conductive channel is used for transporting a substantial part, preferably at least 50 percent, of the heat generated in the electronic components to the photovoltaic panel when the side of the photovoltaic panel to which the electronics assembly is connected to is not or poorly ventilated.

The electronics assembly is thermally coupled to the photovoltaic panel using a thermally conductive substrate such that a substantial part of the heat generated by electrical components may be efficiently transported to and dissipated by the photovoltaic panel. The electronics assembly thus effectively uses the photovoltaic panel as a heat sink. This heat transport may be especially effective and advantageous if the backside of the photovoltaic panel is poorly ventilated. The use of the thermally conductive substrate eliminates the need for expensive cooling structures such as cooling fins or the like. Moreover, even if no or little ventilation at the back of the panel is present, effective cooling of the electronics is provided. The thermally mounted electronics assembly may thus provide a simple, low cost, well-defined and predictable system which is stable over a long period of time.

In one embodiment the thermal conductivity of the substrate may be between approximately 10 and 600 W/(mK). In a further embodiment, the base substrate may be a metal substrate, such as comprising aluminium, an aluminium alloy or copper.

In an embodiment the size of the contact area may be chosen such that the dissipated heat of the electronic components causes an additional increase of the temperature of the photovoltaic panel in the contact area no more than 50 percent, alternatively no more than 30 percent, or alternatively no more than 20 percent, of the temperature difference between the photovoltaic panel and the air outside the contact area. Hence, by choosing the site of the contact area the temperature increase in the photovoltaic panel in the contact area may be efficiently controlled.

In a variant the electronic assembly may further comprise a cover located over the electronic components, wherein the cover may comprise a substantially flat surface. As the photovoltaic panel functions as a heat sink for the heat generated in the electronic components no special cooling structures and/or conductive materials are required for the cover. The height of the cover may be low and the surface of the cover may be smooth so that the problems with regard to dirt clogging is eliminated or at least drastically reduced. In one variant the cover may be comprised of plastic, thereby providing a very cheap cover for an electronics assembly when compared with known assemblies.

In another variant the area covered by the cover is substantially smaller than the contact area of the substrate. In particular when the cover is made of a material with a low thermal conductivity, e.g. plastic, the cover will locally degrade the heat exchange between the photovoltaic panel and the surrounding air. Hence, for that reason it is desired in one embodiment to minimize the area covered by the cover.

In a further variant at least one of the electronic components is a by-pass diode. In yet another variant at least part of the electronic components may form a converter, e.g. a dc-dc converter or an inverter, a battery charge controller and/or an active bypass diode. The electronics assembly may comprise an inverter and, optionally, monitoring and control electronics, such that each photovoltaic panel may be individually optimized by biasing the panel at its Maximum Power Point (MPP) which may vary from panel to panel.

In a further variant at least one of the electronic components may be fixed to the substrate using a thermally conductive adhesive. In one variant the adhesive may comprise thermally conductive metal particles such as Ag or BN particles in a conductive epoxy.

In one variant the assembly may comprise at least one intermediate heat sink in thermal contact with the electronic components and the substrate, wherein the heat dissipated by the components is conducted via the intermediate heat sink to the substrate. The electronic components may be mounted on a printed circuit board and the printed circuit board is thermally connected to the intermediate heat sink using, for example, a phase change material or thermally conductive grease. Using an intermediate heat sink, the effective contact area may be gradually increased for efficiently transporting the heat to the solar panel. Increasing the heat conductive surface allows use of adhesives of lower, but still suitable thermal conductivity properties.

In one embodiment the photovoltaic cells in the laminate may be arranged in rows and columns and the substrate may be in contact with the laminate such that it is in thermal contact with at least four photovoltaic cells. In this embodiment the effective surface of the substrate may be enhanced as the thermal conductivity of the Silicon PV cells is relatively high (approx. 80-150 W/(mK)). This effect may be further exploited by increasing the thermal contact area of the substrate to include more photovoltaic cells e.g. six, nine, twelve etc. photovoltaic cells.

In yet a further embodiment the solar panel system may further comprise at least one glass cover arranged over the photovoltaic cells and/or at least a metal support for supporting the cells in the solar panel system.

Other features and advantages of the present invention will become apparent to one with skill in the art upon examination of the following drawings and the detailed description. It is intended that all such additional features and advantages be included herein within the scope of the present invention, as defined by the claims.

BRIEF DESCRIPTION OF THE DRAWINGS

The invention may be better understood with reference to the following drawings. The components in the drawings are not necessarily to scale, emphasis instead being placed upon clearly illustrating the principles of the present invention. It will be understood that the invention is not in any way restricted to these specific embodiments. In the drawings, like reference numerals designate corresponding parts throughout the several views.

FIGS. 2A-2C depict schematics of electronic assemblies mounted on a substrate according to various embodiments of the invention.

DETAILED DESCRIPTION

Figure 1:
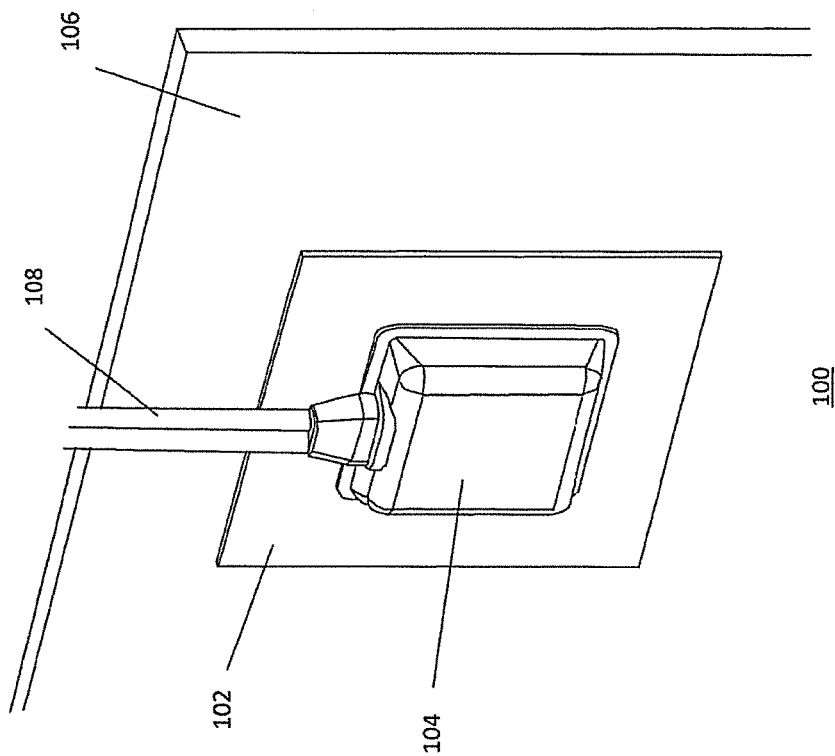
FIG. 1 depicts a schematic of an electronics assembly according to one embodiment of the invention.

Referring now in greater detail to the drawings, FIG. 1 depicts a schematic of an exemplary electronics assembly 100 for a photovoltaic panel according to one embodiment of the invention. In this embodiment, the electronics assembly or module may comprise a substrate 102 of a material with a medium or high thermal conductivity such as a metal e.g. stainless steel 16-27, steel 50, aluminum 220, aluminum alloys (e.g. with Cu) 120-180, gold 318, silver 429 and boron nitride (BN) 600 (in W/(mK)). Other materials however are also possible. For example, the substrate may be of a polymer with a high thermal conductivity. In one embodiment, the substrate may be a Metal Clad PCB (MCPCB). Such substrate comprises a metal sheet (Aluminum, Steel, Copper) of 1-2 mm, a 0.05-0.5 mm isolation layer and a conductive metallic (typically Copper) pattern on top of the isolation layer.

The substrate 102 may be a thin, flat substrate in one embodiment which may be mounted onto the back of a PV panel 106 such that the whole substrate is in reasonably good thermal contact with the panel. The substrate 102 may be thermally fixed to the back of the panel 106 using an adhesive having an acceptable thermal conductivity allowing to thermally connect the electronics components to the substrate in one embodiment. Such adhesives are well known in the field of electronic packaging. It may be understood that the shape of the substrate 102 is not limited to substantially flat surfaces, but may have any shape, e.g. curved shapes, required to provide good thermal contact over substantially the whole surface of the substrate.

The substrate 102 may function as a base substrate for mounting electronic components. A cover 104 may be placed over the electronics so to form a protective housing. Wiring 108 connects the electronics to further PV panels, the grid, batteries and/or a data link.

FIG. 2A illustrates one embodiment of an electronics assembly comprising electronic components 204a-208a mounted onto the thermally conductive substrate 202a. The electronics may include a transformer 206a, e.g. a class II isolation transformer, and (electrolytic) capacitors 208a for use in an AC-inverter scheme. Electrical components with a large contact area, e.g. a transformer and/or capacitors may be mounted directly onto the substrate using a thermally conductive adhesive in order to achieve good thermal contact with the substrate.

The thermal mounting of electronic components with a small contact area, e.g. surface mounted devices (SMD) type components, to a printed circuit board (PCB) 204b, is illustrated in more detail in FIG. 2B. In order to enable those components to be in good thermal contact with the substrate 202b, an intermediate heat sink 210b, i.e. a metal slab of high thermal conductivity such as aluminum or copper, is used. Heat produced in the electronic components 212b mounted on the PCB 204b will be transported through the Copper wiring and via 214b of the PCB to the intermediate heat sink 210b. The effective heat conductive surface of the PCB may be rather small, e.g. approx. 50-100 mm. Therefore, for efficient heat transport the PCB is in good thermal contact with the intermediate heat sink 204b using a phase change material 216b. Above a certain threshold temperature the interface of the phase change material melts and excludes the micro air voids at the surfaces providing a near perfect interfacial thermal resistance. The bond thickness may be relatively thin thereby providing a low thermal resistance. In other variants a thermally conductive paste or adhesive may be used.

The intermediate heat sink may have a thickness of 2-6 mm and may have an area of approx. 1000 mm2 or more for increasing the thermal surface for heat conduction. The intermediate heat sink may therefore be mounted to the substrate using a high thermal conductive, electrically insulating polymer slab 218b. The polymer material is soft allowing efficient thermal contact with the substrate surfaces which may comprise small irregularities on its contact service (e.g. a 1 mm thick Gappad Vu Ultrapad having a thermal conductivity of 1 W/(mK) may provide good thermal contact to services with surface irregularities in the order of 0.2 mm).

Finally, as the thermal contact area of the substrate 202b is much larger than the thermal contact area of the intermediate heat sink, the requirements for the thermal conductivity of the adhesive 220b for mounting the substrate to the photovoltaic panel 222b are less stringent. Any adhesive with a thermal conductivity comparable or better than glass (0.8 W/(m"K)) may be used for that purpose, e.g. a VHB acrylate provided by 3M®.

From the above, it follows that the heat produced by the electronic components mounted on the PCB is transferred to the substrate via one or more thermally connected intermediate heat sinks thereby gradually increasing the effective contact area for heat transport to the solar panel. Increasing the heat conductive surface allows use of adhesives of lower, but still suitable thermal conductivity properties (e.g. around 1 W/(mK)). The electronics module may further comprise monitoring electronics for real-time monitoring and control of the power generated by the PV panel and to keep the PV panel biased in its Maximum Power Point (MPP).

FIG. 2C illustrates a further embodiment of the invention. This figure depicts a situation wherein the substrate 202c also functions as a cover. In the substrate one or more cavities 220c are formed which houses the electronic components 212c. In this embodiment the components are connected to a PCB 204c and may be thermally mounted to the substrate in a similar way as described with reference to FIG. 2B. The substrate may be connected to the back of the solar panel 222c using a thermally conductive adhesive 220c. Hence, using the substrate as a cover provides a very efficient and cheap way of thermally mounting an electronic module to a solar panel.

It is to be understood that the invention is not limited to the embodiments depicted in FIG. 2A-2C. In further variants (not shown) the electronics may be directly placed on the backside of the solar cell or on a thermally conductive layer on or inside the photovoltaic laminate. In that case the (metal clad) PCB functions as a substrate for thermally mounting the electronics into the solar panel. In another variant, the intermediate substrate may comprise one or more heat pipes in order to further improve heat conduction. A planar heat pipe (heat spreaders) provides a transfer mechanism that can transport large quantities of heat with a very small difference in temperature between the hotter and colder interfaces. Inside a heat pipe, at the hot interface a fluid turns to vapor and the gas naturally flows and condenses on the cold interface. The liquid falls or is moved by capillary action back to the hot interface to evaporate again and repeat the cycle.

Figure 3:
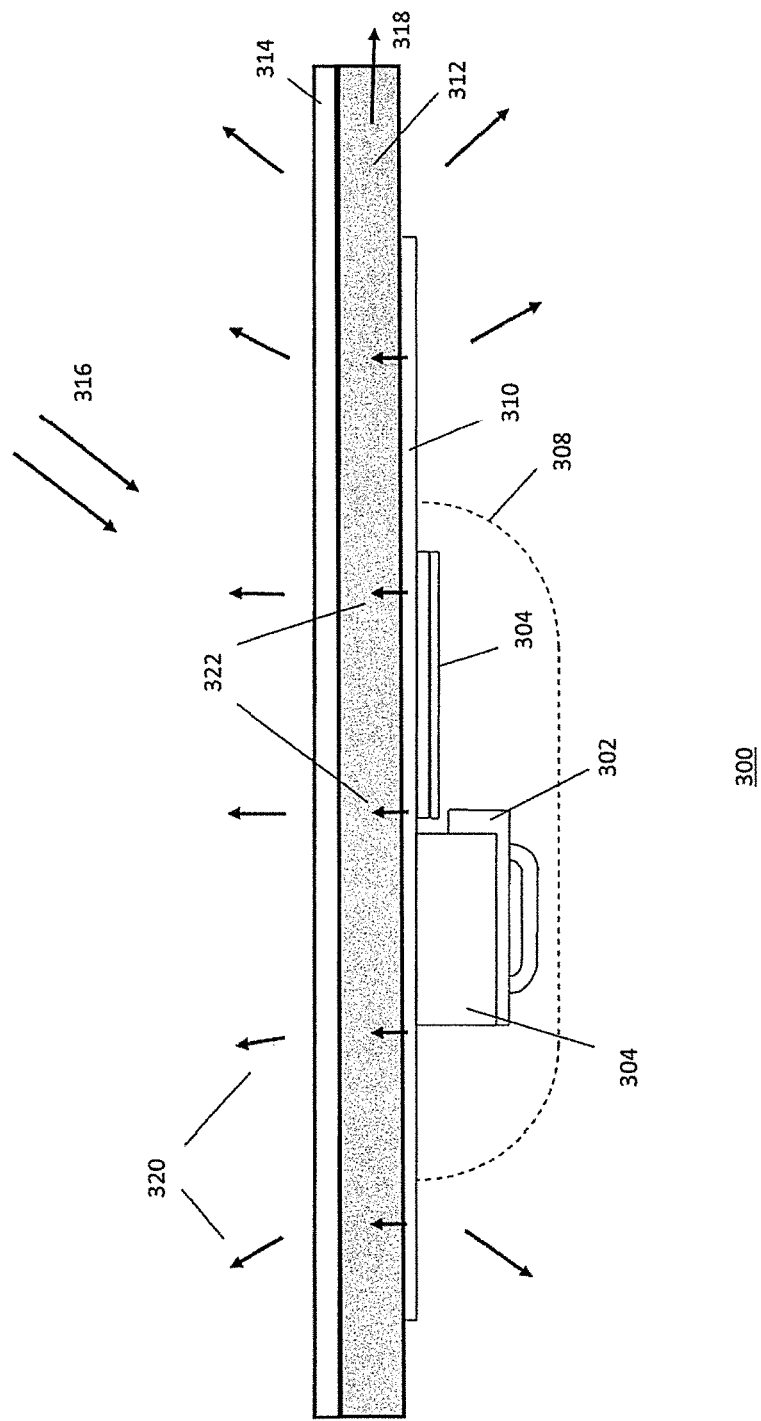
FIG. 3 depicts a schematic of a heat balance of a PV panel system according to one embodiment of the invention.

FIG. 3 schematically depicts the various heat transfer mechanisms in a PV panel system 300 comprising an electronics assembly comprising electrical components 302-306 and a cover 308 mounted on a thermally conductive substrate 310 as described with reference to FIGS. 1 and 2A-2C. The electronics assembly is thermally mounted on the back of a PV panel so that a heat conductive channel between the electrical components and the PV panel is created for efficiently transporting the heat generated by the electronics through the substrate into the PV panel.

The PV laminate may comprise a glass top layer 314 and may comprise an assembly of interconnected and encapsulated PV-cells 312. Such cells may include silicon cells, comprising mono-crystalline, poly-crystalline, micro- and nano-crystalline and/or amorphous Silicon, including thin-films thereof. Further the PV laminate may include PV cells comprising a PV semiconductor selected from the group consisting of GaAs and related III-V compounds, CdTe, Cu (In, Ga) (Se, S) CdSe, PbS, PbSe. Further, the PV cells may comprise engineered PV materials, e.g. quantum dot superlattices, dye-sensitized materials, polymers and/or any other photovoltaic material suitable for use in a photovoltaic cell.

In this example it is presumed that at "peak sun", 1000 W/m2 of power reaches the surface of PV panel (schematically indicated by arrows 316). One hour of full sun thus provides 1000 Wh per m2=1 kWh/m2, representing the solar energy received in one hour on a cloudless summer day on a one-square meter surface directed towards the sun. Today the conversion efficiency of the PV panel lies approximately between 15 and 21 percent, so that between 150 and 210 W/m2 is converted into electrical power (schematically indicated by arrow 318).

Further, approximately 4-5 percent (40-50 W/m2) of the power is reflected by the PV cell to its surroundings (schematically indicated by arrows 320). Hence, in total between 740 and 800 W/m2 may be absorbed by the PV panel thereby increasing the temperature of the PV panel unit.

As the heat transported away from the PV panel by convection and radiation equals the heat absorbed by the PV panel, the temperature difference between the air surrounding the PV panel and the temperature of (the PV cells of) the panel may thereof rise as much as 30 to 50° C. above the ambient (air) temperature.

By thermally mounting the electronics module on the PV panel, the heat generated by the electronics comprising e.g. a dc-ac converter (inverter) for converting the photo-induced dc voltage into an ac voltage, may be transported via the substrate into the PV laminate (schematically indicated by arrows 322) and may cause a local temperature increase in the area where the substrate is in contact with the PV laminate.

The conversion efficiency of a PV cell will typically decrease with increasing temperature. For most crystalline silicon solar cells the voltage reduction is about 0.4%/° C. (about 2 mV/K per cell). Hence, in the design of the electronics module it is suitable to keep the temperature increase in the PV cells due to heating of the electronics module as low as possible.

A typical 250 W inverter with a efficiency of 95% will dissipate approximately 12.5 W. Hence, when taken 250 mm by 250 mm substrate, $12.5/(0.25 \times 0.25) = 200$ W/m$^2$ is dissipated locally at the contact area with the PV panel in addition to the 800 W/m$^2$ absorbed power from the sun assuming all the heat dissipated by the electronics is transported via heat conduction to the PV panel. In a first approach this will result in an additional temperature rise of 200/800=25% of the normal temperature rise at and in the direct vicinity of the contact area with the substrate. Hence, the local temperature rise may be easily controlled by the size of the thermal contact area between the electronics module and the PV panel.

In practice not all heat will be transported to the PV panel as radiative heat transfer and a small amount of heat convention transfer will be always present. Hence, in case the backside is not well vented (e.g. when a simple smooth plastic cover over the electronic components is used or when the cooling elements at the backside are clogged with dirt), a substantial part, approximately 50-90 percent, of the heat generated in the electronic assembly may be transported through heat conduction via the thermally connected substrate to the PV panel, without seriously affecting the performance of the PV panel.

When measures are taken to improve the heat transport through convection on the backside, e.g. by means of cooling structures and ventilation provided on the cover and/or the substrate less than 50 percent may be transported to the PV module through heat conduction, while the rest of the heat is transported away on the backside through convection. In that case, the thermal contact may provide an auxiliary heat conductive channel for conducting heat generated by the electronics to the PV cell when the functioning of the cooling structures is disabled, e.g. by dirt or the like.

Moreover, the size of the contact area may be chosen to control the heat conduction to the PV panel and the temperature increase of the PV panel in contact with the substrate. In one embodiment the contact area of the substrate may be chosen such that heat dissipated by the electronic components increases the temperature of the photovoltaic panel in the contact area with no more than 50 percent of the temperature difference between the temperature of the photovoltaic panel and the ambient air temperature measured outside the contact area. This may relate to a situation wherein no or little heat transfer through convection takes place at the backside of the solar panel.

If the backside of the solar panel is well ventilated and the contact area is sufficiency large, then the increase of the temperature of the photovoltaic panel in the contact area may be substantially lower, i.e. less than 30 percent of the temperature difference between the temperature of the photovoltaic panel and the ambient air temperature outside the contact area. Moreover, when efficient backside cooling is provided, e.g. using cooling structures on the substrate and/or on the cover, zero percent temperature increase or even a temperature decrease may be achieved. In the latter case, the electronics assembly effectively functions as a heat sink for the PV panel.

Figure 4:
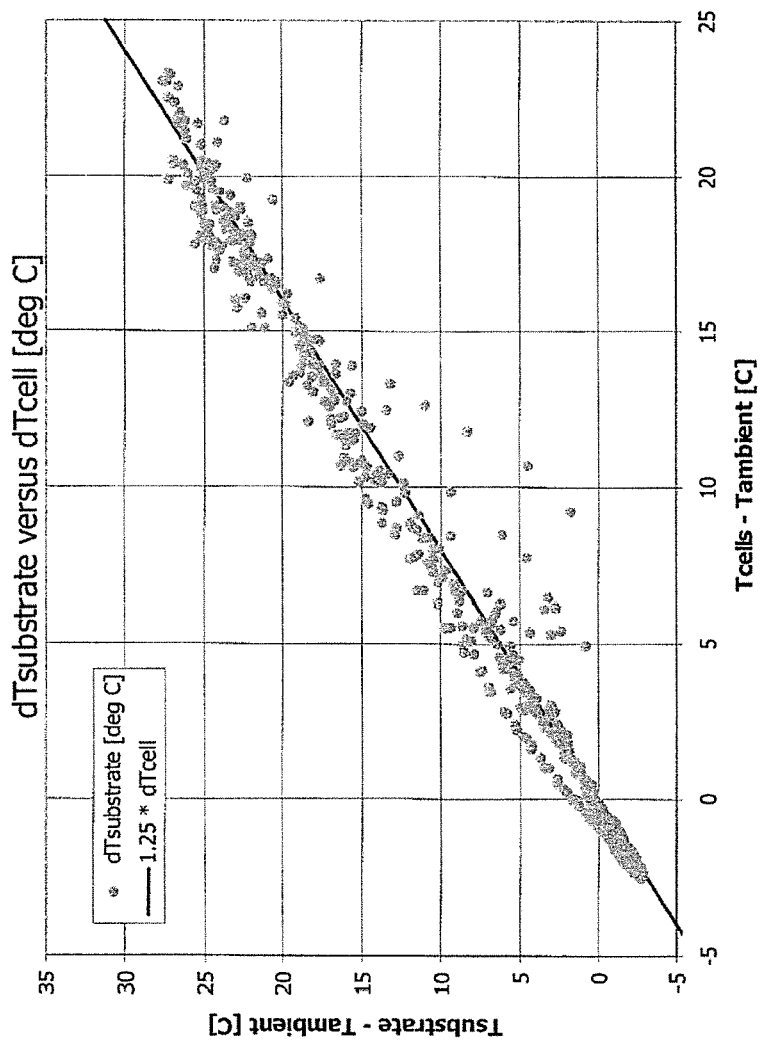
FIG. 4 is a graph illustrating the temperature increment of the substrate vs. the temperature increment of the PV cells away from the contact area m a solar panel.

FIG. 4 depicts a graph comprising experimentally measured data illustrating linear behavior between the temperature difference between the substrate and the surrounding air temperature and the temperature difference between the PV cells and the surrounding air located away from the contact area of the electronics module. In this example, the electronics module comprises a substrate area of 250 mm×250 mm and a cover area of 150 mm×150 mm. From these measurements it follows that the electronics module according to the invention provides a simple and cheap way of allowing the heat generated by the electronics to be controllably dissipated by the PV panel, in particular the PV laminate.

Thus, although a local increase of the temperature of the photovoltaic panel in the contact area will result in some reduction in the efficiency of the PV cells in that area, the thermally mounted electronics modules may provide a simple, cheap and well-defined and predictable PV system which is stable over a long period of time.

Note that this local increase of temperature will not differ very much from prior-art PV panels comprising electronics that are not in direct thermal contact with the PV panel. Thermal radiation of the housing and transfer of heat through convection to the PV panel (because the electronics housing is thermally isolated from the PV panel using an air gap) will result in a local increase of the temperature and thus in some reduction of the efficiency.

As the electronics module effectively uses the PV panel as a heat sink, the cover of the electronics module may be a simple and cheap plastic cover, for example, with a smooth upper surface that is not sensitive to the clogging of dirt. As the plastic is a low thermal conductor and the plastic cover will locally decrease the heat exchange with its surroundings, the area covered by the plastic cap should be minimized or the area of the substrate should be sized accordingly.

Figure 5:
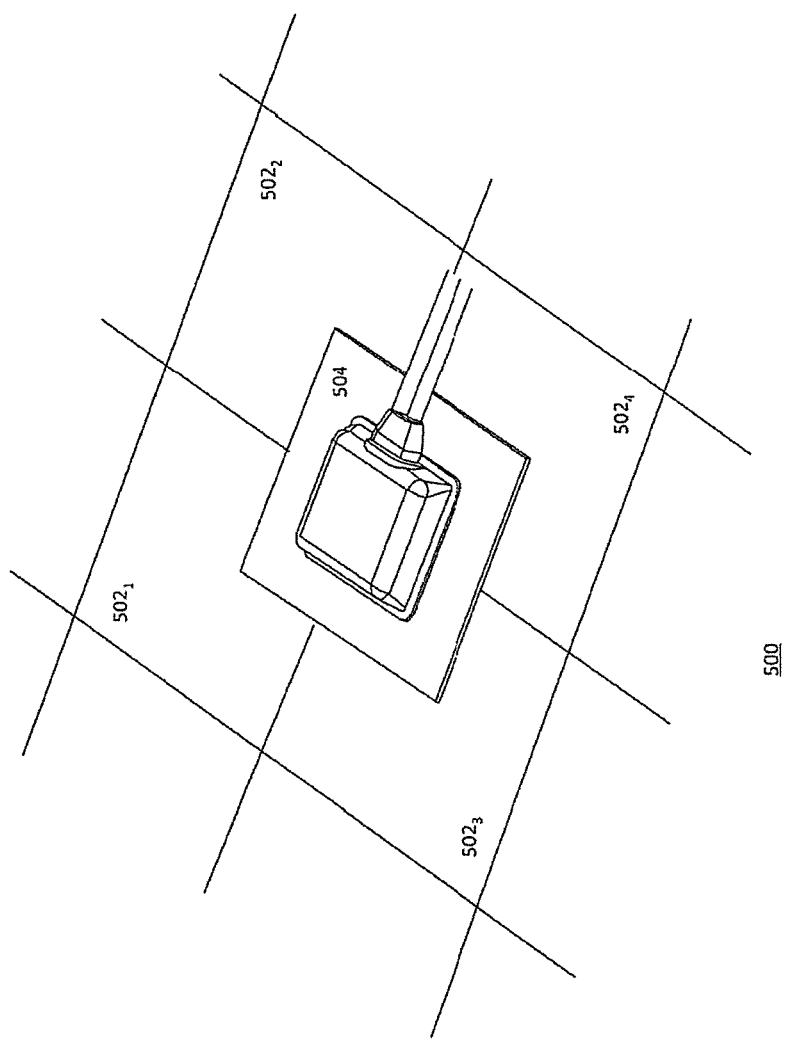
FIG. 5 depicts the thermal mounting of an electronics assembly to a PV panel according to one embodiment of the invention.

FIG. 5 depicts a schematic of way of increasing the effective thermal contact surface of the substrate of the electronics module according to one embodiment of the invention. In this example the PV panel 500 comprises an array of interconnected PV cells $502_1$-$502_4$ which are arranged side-by-side over the area of the PV panel. The electronics module 504 is thermally mounted on the PV panel such that the thermal contact area covers at least part of the areas of four PV cells $502_1$-$502_4$. As the thermal resistance of silicon is low, the heat generated by the electronics may be efficiently spread via the thermal conductive substrate into the four PV cells. For example, a temperature rise of the four silicon cells (of the 60 cells in a panel) due to heat generation in electronics of the electronics module, will result in a relative voltage reduction of 4 cells/60 cells*10 degrees*0.4%=0.27%. Since all cells are operated at the same current (since they are connected in series) the relative power loss will equal the relative voltage loss. Hence, the relative power loss due to local heating of the cells may be just 0.24%. Note that this is at maximum irradiation of the sun.

Therefore, the annual average loss will be much lower (on the order of 0.1%).

Figure 6:
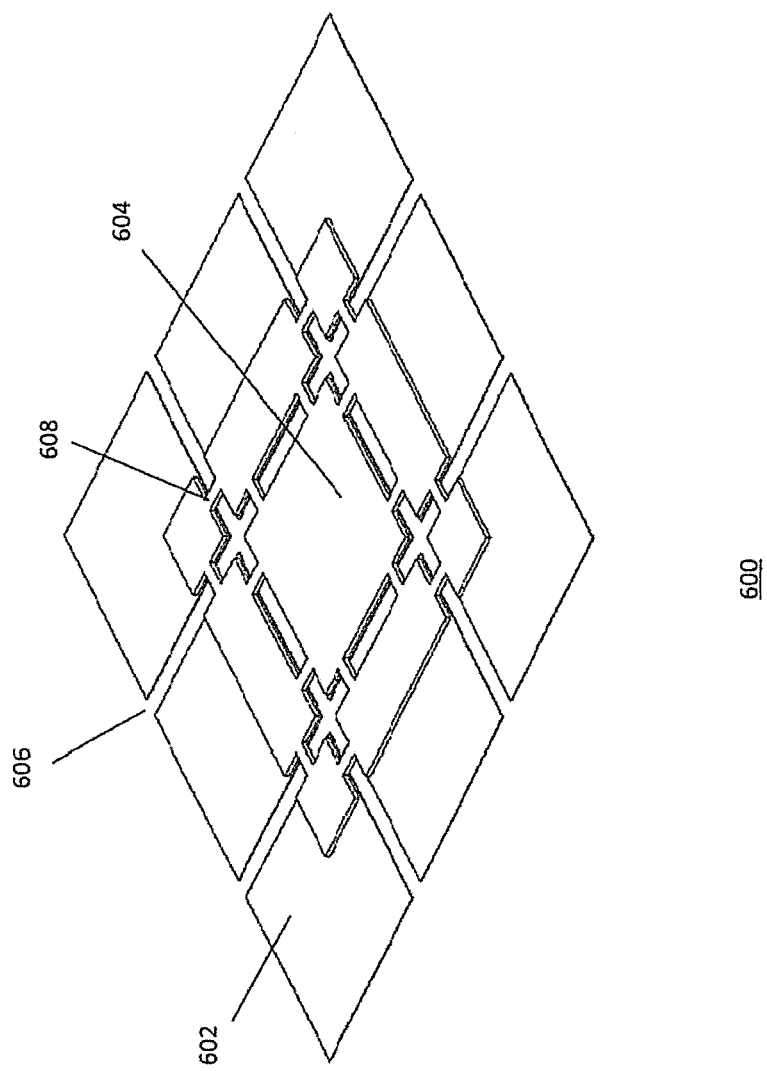
FIG. 6 illustrates a thermally conductive substrate of an electronics assembly according to yet another embodiment of the invention.

FIG. 6 illustrates a further variant of a thermally conductive substrate 604 of an electronics assembly (not shown) in thermal contact with a number of PV cells 602 of a partly light-transmissive PV panel 600. Light transmission is achieved by arranging the PV cells on a light transmissive backsheet (e.g. glass or light-transmissive Tedlar®) so that longitudinal slits 606 of e.g. 10-20 mm width are formed allowing light to pass through, so that—similar to the situation in FIG. 5—the heat generated by the electronics components may be dissipated by the PV cells. The conductive substrate comprises openings which follow the light-transmissive slits of the PV panel so that the conductive substrate does not locally inhibit the light-transmissive properties of the PV panel. Connection parts 608 in the openings of the substrate ensure that the heat conductive properties of the substrate are sufficient for effective heat transfer to all PV cells in contact with the substrate.

Moreover the width of the connection parts is small such that from large distances the mounted electronics will not be visible.

It is to be understood that any feature described in relation to any embodiment may be used alone, or in combination with other features described, and may also be used in combination with one or more features of any other of the embodiments, or any combination of any other of the embodiments. For example, although it is described that the cover may be a plastic cover having a smooth surface, in other variants the cover may be of a material with a high thermal conductivity such as aluminium or the like in order to further improve the heat exchange with the surroundings of the PV panel. Further, the cover and/or the substrate may comprise cooling structures, i.e. structures which may further provide temperature reduction of the electronics and/or PV panel. Such structures may include holes, ribs and/or cylindrical cooling structures provided in the substrate and/or cover. For example, punching every 3 mm a hole of 2 mm in a 2 mm thick aluminium sheet doubles the surface area while saving ⅓ on aluminium in weight. In one embodiment the substrate may comprise holes in such an arrangement that the density of holes close to the electronics is less than the density of the holes further away from the electronics. That way the heat may still be efficiently transported away through the aluminium while at the same time increasing the surface area. Further equivalents and modifications not described above may also be employed without departing from the scope of the invention, which is defined in the accompanying claims.

Many variations and modifications may be made to the preferred embodiments of the invention without departing substantially from the spirit and principles of the invention. All such modifications and variations are intended to be included herein within the scope of the present invention, as defined by the following claims.

What is claimed is:

1. An electronics assembly for a photovoltaic panel comprising:
    a substrate of a thermally conductive material, wherein the substrate defines a thermal contact area for thermally contacting the electronics assembly to a photovoltaic panel; wherein the substrate is distinct from the photovoltaic panel;
    at least one electronic component comprising at least one of a transformer, a capacitor, and a bypass diode provided on the substrate and in thermal contact with the substrate, so that when the electronics assembly is in thermal contact with the photovoltaic panel, via the substrate, the thermal contact provides a heat conductive channel between the at least one electronic component and the photovoltaic panel through the substrate, wherein the heat conductive channel enables the electronics assembly use the photovoltaic panel as a heat sink for heat produced by the at least one electronic component; and a cover located over the at least one electronic component and covering an area of the substrate;

wherein the area covered by the cover is substantially smaller than the thermal contact area.

2. The electronics assembly according to claim 1, wherein the area covered by the cover is less than about 50% of the contact area.

3. The electronics assembly according to claim 1, wherein the area covered by the cover is less than about 30% of the contact area.

4. The electronics assembly according to claim 1, wherein the cover comprises a substantially flat surface running in parallel to the contact area.

5. The electronics assembly according to claim 1, wherein the material of the cover is made of a material selected from plastic and metal.

6. The electronics assembly according to claim 5, wherein the metal is selected from steel, aluminium and stainless steel.

7. The electronics assembly according to claim 1, wherein the thermal conductivity of the substrate is between 10 and 600 W/(m K).

8. The electronics assembly according to claim 1, wherein the substrate comprises at least one layer of metal.

9. The electronics assembly according to claim 8, wherein the metal is selected from steel, stainless steel, aluminium, aluminium alloys and copper.

10. The electronics assembly according to claim 1, wherein at least one of the at least one electronic component comprises at least one of a bypass diode, a dc-dc converter, an inverter, a battery charge controller and an active bypass diode.

11. The electronics assembly according to claims 1, wherein the assembly further comprises at least one intermediate heat sink in thermal contact with the at least one electronic component and the substrate, wherein the heat dissipated by the at least one electronic component is conducted via the intermediate heat sink to the substrate.

12. The electronics assembly according to claim 11, wherein the at least one electronic component is mounted on a printed circuit board and the printed circuit board is thermally connected to the intermediate heat sink using a phase change material.

13. The electronics assembly according to claim 1, wherein at least one of the substrate and the cover comprises at least one cooling structure.

14. The electronics assembly according to claim 1, wherein the at least one electronic component is thermally connected to the substrate using a thermally conductive adhesive.

* * * * *

UNITED STATES PATENT AND TRADEMARK OFFICE
CERTIFICATE OF CORRECTION

PATENT NO.       : 8,933,324 B2
APPLICATION NO.  : 13/343872
DATED            : January 13, 2015
INVENTOR(S)      : Hendrik Oldenkamp et al.

It is certified that error appears in the above-identified patent and that said Letters Patent is hereby corrected as shown below:

On the title page item (73), replace "SMA Solar Technology AG, Neubiberg (DE)" with
--SMA Solar Technology AG, Niestetal (DE)--

Signed and Sealed this
Twentieth Day of October, 2015

Michelle K. Lee
*Director of the United States Patent and Trademark Office*